United States Patent [19]

Muragishi et al.

[11] Patent Number: 5,172,200

[45] Date of Patent: Dec. 15, 1992

[54] MOS MEMORY DEVICE HAVING A LDD STRUCTURE AND A VISOR-LIKE INSULATING LAYER

[75] Inventors: Takeo Muragishi; Eiichi Arima, both of Hyogo, Japan

[73] Assignee: Mitsubishi Denki Kabushiki Kaisha, Tokyo, Japan

[21] Appl. No.: 637,428

[22] Filed: Jan. 4, 1991

[30] Foreign Application Priority Data

Jan. 12, 1990 [JP] Japan .................. 2-5163

[51] Int. Cl.⁵ .......................... H01L 29/78
[52] U.S. Cl. .................. 257/315; 365/185; 257/324; 257/344; 257/411
[58] Field of Search .......... 357/23.1, 23.3, 23.5, 357/23.14, 54; 365/185

[56] References Cited

U.S. PATENT DOCUMENTS

| 4,376,947 | 3/1983 | Chiu et al. | 357/23.5 |
| 4,573,144 | 2/1986 | Countryman, Jr. | 365/185 |
| 4,835,740 | 5/1989 | Sato | 357/23.5 |
| 4,939,558 | 7/1990 | Smayling et al. | 357/23.5 |
| 4,939,690 | 7/1990 | Momodomi et al. | 357/23.5 |
| 4,964,143 | 10/1990 | Haskell | 357/23.5 |

FOREIGN PATENT DOCUMENTS

| 53-89686 | 7/1978 | Japan | 357/23.5 |
| 54-93957 | 7/1979 | Japan | |
| 56-21370 | 2/1981 | Japan | |
| 56-26472 | 3/1981 | Japan | 357/23.5 |
| 59-105371 | 6/1984 | Japan | 357/23.5 |
| 60-145666 | 8/1985 | Japan | 357/23.5 |
| 61-229368 | 10/1986 | Japan | 357/23.5 |
| 61-253865 | 11/1986 | Japan | |
| 61-258479 | 11/1986 | Japan | |
| 62-9229 | 2/1987 | Japan | 357/23.5 |
| 62-140472 | 6/1987 | Japan | |
| 62-145729 | 6/1987 | Japan | |
| 63-44767 | 2/1988 | Japan | |
| 63-306674 | 12/1988 | Japan | |

Primary Examiner—Rolf Hille
Assistant Examiner—Steven Loke
Attorney, Agent, or Firm—Lowe, Price, LeBlanc & Becker

[57] ABSTRACT

A non-volatile semiconductor memory device includes a memory transistor of a dual gate structure in a memory cell adapted for storing memory information. The transistor includes a floating gate and a control gate insulated by an interlayer insulating layer having a laminated structure of silicon oxide and silicon nitride films. The nitride film of the interlayer insulating layer has a visor-like portion protruding from and overlying a portion of the lateral surface of the floating gate. The transistor further is comprised of impurity regions in a so-called LDD structure.

14 Claims, 12 Drawing Sheets

MOS MEMORY DEVICE HAVING A LDD STRUCTURE AND A VISOR-LIKE INSULATING LAYER

CROSS REFERENCE TO RELATED APPLICATION

This application is related to copending application Ser. No. 377,935, filed Jul. 11, 1989, now abandoned.

BACKGROUND OF ART

1. Field of the Invention

This invention relates to MOS device having LDD structure and manufacturing method therefor, in particular to a semiconductor memory device having a dual gate structure such as an EEPROM structure.

2. Description of the Background Art

Conventionally, integration density of semiconductor devices has been increased by miniaturizing the structure of the devices by virtue of the development of the fine processing technique. In a MOS type field effect transistor (Metal-Oxide-Semiconductor Field Effect Transistor; hereinafter referred to as a MOSFET), a gate length is shortened from the order of microns to the order of submicrons as the device structure has been miniaturized. As the gate length become shorter, the channel length also becomes shorter, causing a commonly called short channel effect. More specifically, as the channel length becomes shorter, the electric field concentrates near the drain, and therefore the generation of hot carriers has become a serious problem. The hot carriers enter the gate oxide film, causing changes of the threshold voltage on time basis degrading mutual conductance, thereby damaging the reliability of the MOSFET.

EEPROM (Electrically Erasable and Programmable Read Only Memory) is one of memory devices using MOSFETs, which is used in a microcomputer or the like.

FIG. 9 is a block diagram showing a widely known conventional EEPROM which provides for writing and erasure of electrical information or data.

Referring to FIG. 9, the EEPROM includes a memory array 50, comprised of EEPROM cells, a row address buffer 51 receiving a row address signal from outside, a column address buffer 52 receiving a column address signal, a row decoder 53 and a column decoder 54 decoding these address signals and applying an electrical voltage to word and bit lines connected to specified memory cells, a sense amplifier 56 reading a signal stored in the memory cell designated by the two decoders via a Y gate 55, an output buffer 57 for outputting read out data and a control signal input buffer 58 receiving control signals from outside and supplying the control signal to other components.

In operation, the sense amplifier 56 operates to amplify a signal stored in a memory cell to supply the amplified signal to the output buffer 57. FIG. 10 is a circuit diagram showing an example of the memory array 50 and the Y gate 55 shown in FIG. 9.

Referring to FIG. 10, the Y gate 55 includes a transistor 60 connected between an I/O line 59 and a bit line 31 and a transistor 63 connected between a CG line 61 and a control gate line 62. A Y gate signal Y2 is supplied to the gate of transistors 60 and 63. Two unnumbered transistors supplied with a Y gate signal Y1 are connected in a similar manner.

In the memory cell 50, 4 bit memory cells are shown. Each memory cell includes memory transistor 6 having a floating gate and a selection transistor 3 having its gate connected to a word line 32 and supplying a signal stored in the memory transistor 6 to bit line 31. Another selection transistor 3a has its gate connected to a word line 32, and is connected to transmit a signal on control gate line 62 to the gate of memory transistor 6.

In operation, memory transistor 6 stores binary signals depending on whether or not electrons are stored in its floating gate. When electrons are stored therein, the threshold voltage of memory transistor is raised. This turns off memory transistor 6 for the reading operation. When electrons are not stored, the threshold voltage of memory transistor 6 is negative to turn on memory transistor 6 for the reading operation.

The readout voltage from a junction is applied via transistor 6 to bit line 31 and hence to memory transistor 6 via selection transistor 3. Thus it becomes possible to detect at a sense amplifier whether or not the current flows in memory transistor and in this manner to read out the signal stored in memory transistor 6.

FIG. 11 is a plan view of a conventional EEPROM having a floating gate, and FIG. 12 is a cross-sectional view taken along section line XII—XII in FIG. 11. The arrangement of the EEPROM is herein after explained by referring to FIGS. 11 and 12.

The EEPROM includes the memory transistor 6 and the selection transistor 3 both formed on the planar surface of a P type silicon semiconductor substrate. The memory transistor 6 includes a tunnel impurity diffusion layer 9, proving to be a drain region on the planar surface of the semiconductor substrate 20, a tunnel insulating film 16 of a reduced film thickness formed in a predetermined region on a floating gate 14 formed at least in a region inclusive of the tunnel insulating film 16 by the interposition of an insulating film 17, and a control gate 7 formed on the floating gate 14 with the interposition of an interlayer silicon oxide film 15. The overlapping region of control gate 7, floating gate 14 and the interlayer silicon oxide film 15 therebetween constitutes a capacitance C1. The floating gate 14, the tunnel impurity diffusion layer 9 connected to a connecting impurity diffusion layer 5 and the tunnel insulating film 16 constitute a capacitance C2. In a region excluding tunnel insulating film 16, the floating gate 14, the semiconductor substrate 20 and the insulating film in the vicinity of the tunnel insulating film 16 also constitute a capacitance C3. The floating gate 14 accumulates electrical charges. Depending on the voltage applied across the control gate 7 and the connecting impurity diffusion layer 5, the electrical charges are ejected and/or injected between the floating gate 14 and the tunnel impurity diffusion layer 9 by way of tunnel insulating film 16. The selection transistor 3 includes the connecting impurity diffusion layer 5 and a drain region 1 formed on the surface of the semiconductor substrate at some distance from each other, with a selection gate electrode 4 being formed therebetween so as to function as a word line. A selection gate silicon oxide film 13 is formed between the selection gate electrode 4 and the planar surface of the semiconductor substrate 20. The drain region 1 is connected to bit line 31 via a contact hole 11.

The operation of the EEPROM is hereinafter explained. The EEPROM has three basic operating modes of readout, erasure and writing.

The following table tabulates the voltages applied to respective circuit portions or components during writing, erasure or readout of information charges into or from floating gate 14,

TABLE

| Circuit Portions or Components | readout | erase | writing |
|---|---|---|---|
| selection gate electrode 4 | 5 V | $V_{pp}$ | $V_{pp}$ |
| control gate 7 | 0 V | $V_{pp}$ | 0V |
| bit line 31 | 2 V | 0 V | $V_{pp}$ |
| source line 12 | 0 V | | floating |
| floating gate 14 | $V_F$ | $V_E$ | $V_W$ |

In the above Table $V_{PP}$ stand for a program voltage, $V_F$ stand for a potential during floating and $V_W$, $V_E$ stand for the potentials at the floating gate 14 during the operations.

As shown in the above Table, during readout, a voltage of 5V is applied to selection gate electrode 4 and a voltage of 2V is applied to bit line 31, whereas the control gate 7 and the source line 12 are grounded.

During erasure of the memory cell, $V_{PP}$, is applied to selection gate electrode 4, whereas bit line 31 and source line 12 are grounded. During this erasure cycle, positive electrical charges are applied to floating gate 14.

During writing, $V_{PP}$ is applied to selection gate electrode 4 and bit line 31 and the control gate 7 is grounded, whereas the source line 12 is in the floating state. This causes negative electrical charges to be extracted from floating gate 14.

With such EEPROM, technical evolution is now under way with an aim towards enhancing the storage capacity. That is, high integration of the EEPROM are now being promoted with miniaturization of the element structure. One of the impediments in the way of miniaturization of the element structure is the phenomenon know as the hot electron effect, in which electrons called hot electrons are injected into the gate oxide film. In miniaturizing the EEPROM, hot electron effect is supposed to be produced in, for example, the reading transistor 10 shown in FIG. 12. That is, as the reading transistor structure becomes smaller in size, a high electrical field is generated in the vicinity of the tunnel impurity diffusion layer 9 and the electrons generated by ionization caused by collision are partially captured by a trap in the gate oxide film 17 so as to act as negative charges. These negative charges give rise to lowered operational reliability, such as fluctuations in the transistor threshold voltage or lowering in the channel conductance. Should the threshold voltage of the reading transistor 10 be fluctuated under such hot electron effect, there is a risk that the malfunction of the reading transistor be caused during reading of the stored data. Such malfunction of the reading transistor 10 detracts from the reliability as the memory and presents a serious problem to the EEPROM.

Meanwhile, in the field of the MOSFET, a so-called lightly doped drain structure (LDD structure) is generally known as the structure preventing such hot electron effect. The LDD structure is generally formed by a side wall spacer formed on a side wall of a gate electrode. At present, since the problem caused by the hot electron effect produced in the reading transistor 10 in the EEPROM is not so serious, no example can be found which applies the LDD structure to a read transistor of an EEPROM. The interlayer silicon oxide film 15 of the read transistor having a dual gate structure shown in FIG. 12 is formed by a thermal oxidation method. Such a high temperature process as a thermal oxidation method destroys the thin tunnel oxide film 16.

In the EPROM, a structure similar to the LDD structure is applied for a certain other object, as disclosed in the JP Patent Laying-Open No. 62-140472 (1987).

SUMMARY OF THE INVENTION

It is an object of the present invention to provide an MOS device having a dual gate and LDD structure.

It is another object of the present invention to provide a non-volatile semiconductor memory device including a memory cell having a double gate transistor of a so-called LDD structure.

It is further object of the present invention to provide a non-volatile semiconductor memory device having a transistor of a dual gate structure, wherein the resistance to insulation destruction between the first gate electrode and the second gate electrode may be improved.

It is a further object of the present invention to provide a simplified process for producing a memory transistor of an LDD structure without a side wall spacer.

This invention provides an MOS device of a dual gate structure which is provided with a semiconductor substrate of a first conductivity type having a planar surface. A first gate insulating layer is formed on the major surface of the semiconductor substrate. A first gate electrode maintained in the electrically floating state is formed above the first gate insulating layer. On the surface of the first gate electrode, there is formed a second gate insulating layer comprised of a laminated structure of the first and second insulating layers. On the surface of the second gate insulating layer, there is formed a second gate electrode larger in size than the first gate electrode along the gate length. In the semiconductor substrate, there are formed a pair of impurity regions of lower concentrations spaced apart from each other. In the semiconductor substrate, there are also formed a pair of impurity regions of a second conductivity type of higher concentrations for facing each other in a direction away from a channel region on the surface of the semiconductor substrate sandwiched between a pair of impurity regions of lower concentrations.

The MOS device according to the present invention has an impurity region of a so-called LDD structure comprised of an impurity region of a lower concentration and an impurity region of a higher concentration. The impurity region of the lower concentration constituting the LDD structure prevents the occurrence of the hot electron effect by releasing the concentration of the electrical field in the vicinity of the impurity region and suppressing the generation of hot electrons.

With the process for producing a MOS device, a first insulating layer, a first electrically layer, a second insulating layer and a third insulating film layer are sequentially formed on the major surface of the semiconductor substrate. An etching mask having a predetermined shape is formed on the surface of the third insulating layer and, using the mask, the third insulating layer and the second insulating layer are patterned by the first etching method. The first electrically conductive layer is patterned by a second etching method having a different selective ratio from that of the first etching method to form a fist gate electrode having a narrower width that of the patterned third insulating layer. Impurity ions are then implanted obliquely into the major surface of the semiconductor substrate using the patterned third insulating layer and the first gate electrode as the masks to form an impurity region of a lower concentration in the semiconductor substrate. Impurity ions are then implanted substantially vertically into the major surface of the semiconductor substrate by utilizing the patterned third insulating film layer to form an impurity region of a higher concentration.

With the process for producing a MOS device, a third insulating layer is formed above the first gate electrode, and a visor-like region of the third insulating film is formed above the first gate electrode by utilizing the etching selection ratio between the third insulating layer and the first gate electrode. This visor-like portion of the third insulating layer is used as the mask defining the boundary between the low concentration impurity region and the high concentration impurity region the oblique ion implantation and the perpendicular ion implantation are combined to enable the LDD structure to be produced by a simplified process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
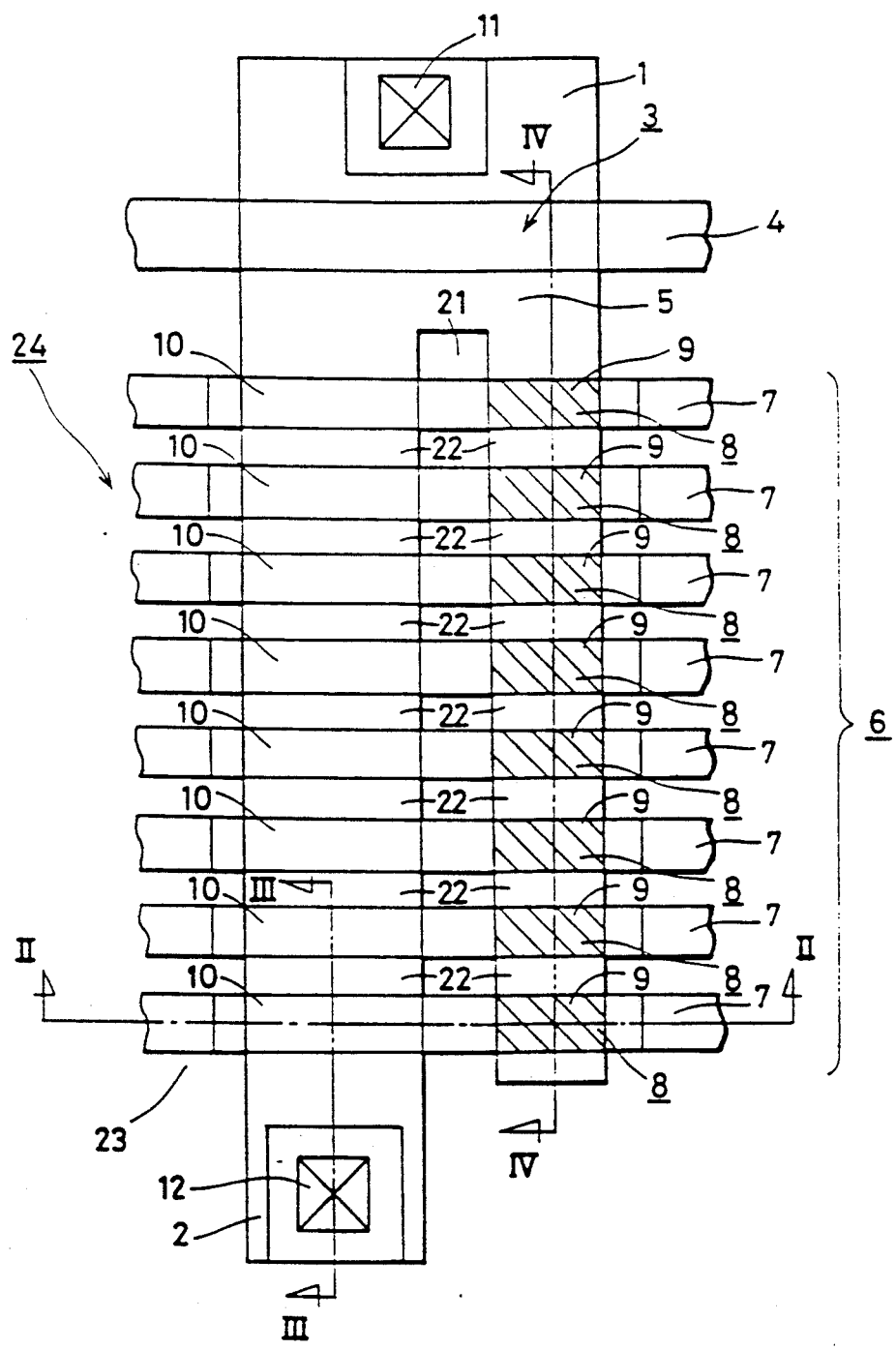
FIG. 1 shows a planar structure of EEPROM memory cells according to an embodiment of the present invention.
Figure 2:
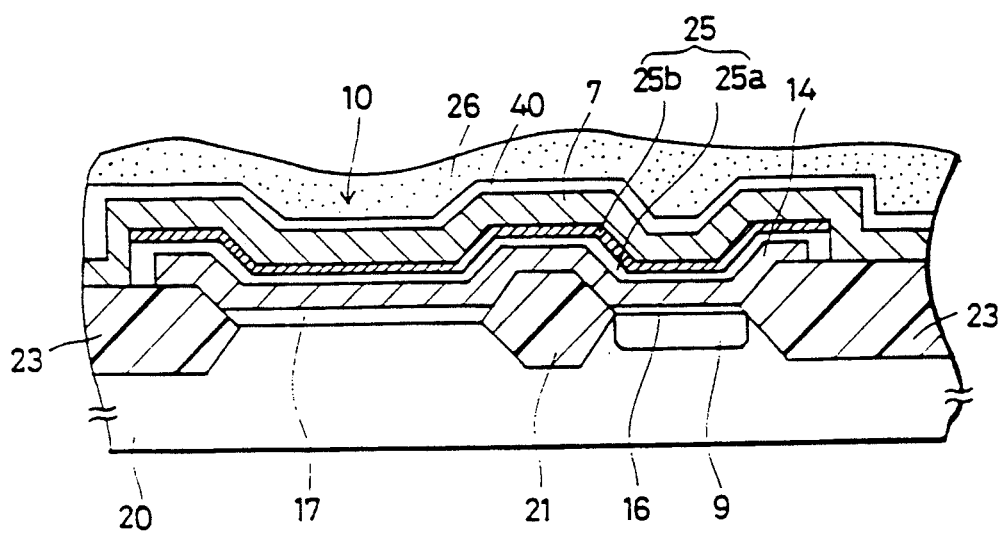
FIG. 2 shows a cross-sectional structure along section line II—II of FIG. 1.

Referring to FIGS. 1 2, 3A and 3B, an EEPROM according to the present invention includes, on the major surface of a p-type silicon substrate 20, 8-bit memory transistors 6 connected in tandem, a selective transistor 3 for connecting one memory transistor 6 disposed at one end of the 8-bit memory transistors 6 to drain electrode 11 and a source line 12 connected to the other end of the 8-bit memory transistors 6. Each memory transistors 6 includes a reading transistor region 10 and a tunnel impurity diffusion layer 9, with the adjacent memory transistors 6 being separated in the source-drain direction by memory connecting impurity diffusion layers 22 formed on the major surface of the semiconductor substrate 20 and also being separated in the direction orthogonal thereto by an element separating field oxide film 23. The reading transistor region 10 and the tunnel impurity diffusion layer 9 are separated from each other by a field silicon oxide film 21. Each memory transistor 6 includes a floating gate 14 formed on the major surface by the interposition of a first gate silicon oxide film (first gate insulating layer) 17, and a control gate 7 formed on the floating gate 14 with the interposition of an interlayer insulating layer, (a second gate insulating layer) 25. The floating gate 14 and the control gate 7 are formed of polycrystalline silicon or metal. Within the p-type silicon substrate 20, there is formed an impurity region of a so-called LDD structure consisting of an n-type memory connecting impurity diffusion layer 22 of a higher concentration and an n-type impurity region 24 of a lower concentration consecutive thereto. A part of the n-type impurity region 24 of the lower concentration is underlying the floating gate 14, whereas the memory connecting impurity diffusion layer 22 of the higher concentration is self-aligned with respect to the interlayer insulating layer 25. A part of the n-type impurity region 24 of the lower concentration is underlying the floating gate 14. This is to prevent the transistor characteristic from changing when the n-type impurity region 24 of the low concentration is disposed apart form the edge of the floating gate 14 or overlapping with the same. The interlayer insulating layer 25 has a laminated structure consisting of an interlayer insulating oxide film 25a surrounding the floating gate 14 and an interlayer insulating nitride film 25b formed on the upper surface of the floating gate 14. The control gate 7 formed on the surface of the interlayer insulating layer 25 has a gate length longer than the floating gate 14.

The region of the tunnel impurity diffusion layer includes an n-type tunnel impurity diffusion layer 9 within the p-type silicon substrate 20. On the surface of the tunnel impurity diffusion layer 9 is formed the floating gate 14 by the interposition of a tunnel oxide film 16 of a lesser film thickness than the first gate silicon oxide film 17 of the reading transistor 10. Electrical charges are injected into the floating gate 14 via tunnel insulating film 16 by Fowler-Nordheim tunneling.

The various regions on the surface of the p-type silicon substrate 20 are covered by an insulating layer 26 of a larger thickness by the interposition of an oxide film 40. The insulating layer 26 includes impurities such as boron therein. The impurities reduces the viscosity of the insulating layer 26 and flattens the surface thereof. The oxide film 40 prevents the impurities in the insulating layer 26 from entering the control gate 7.

With the above described EEPROM, the feature of the present invention resides in the so-called LDD structure applied to the impurity region of the reading transistor 10. Thus it becomes possible to suppress the hot carrier effect which may be brought by the high electrical field in the vicinity of the drain region during the operation of the reading transistor 10. The reading transistor 10 includes the floating gate 14, the interlayer insulating layer 25 and the control gate 7 having a larger width than that of the floating gate 14. Such a dual gate structure facilitates the formation of the LDD structure.

Figure 3A:
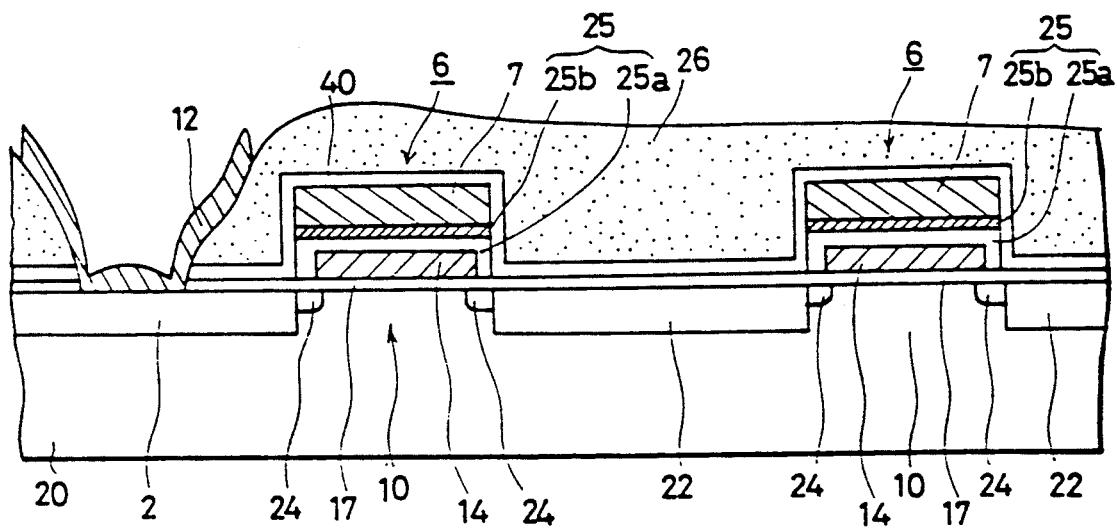
FIG. 3A shows a cross-sectional structure along section line III—III of FIG. 1.
Figure 3B:
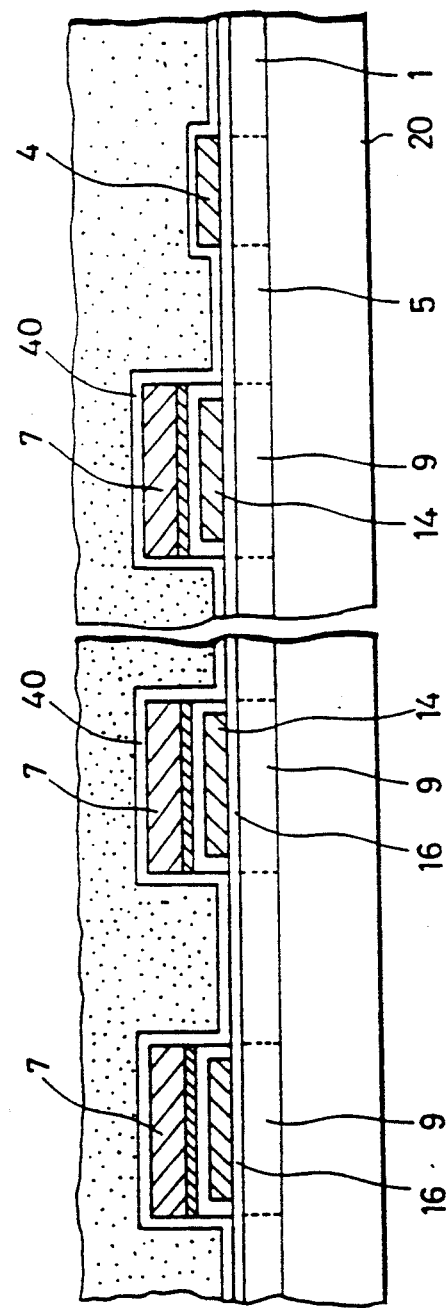
FIG. 3B shows a cross-sectional structure along section line IV—IV of FIG. 1.

The production process of the above described EEPROM memory cell and, above all, of the reading transistor 10 shown in FIG. 3A, is hereinafter explained by referring to FIGS. 4A to 4F.

Figure 4A:
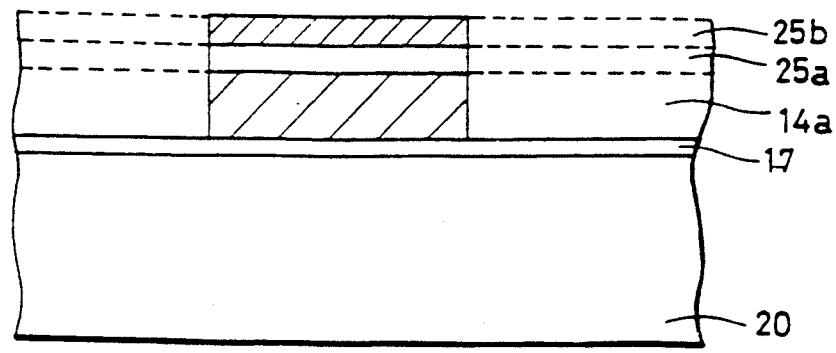
FIGS. 4A, 4B, 4C, 4D, 4E and 4F are cross-sectional views showing the production process of a reading transistor of the EEPROM memory cell.

Referring to FIG. 4A, a field oxide film, (not shown) is formed in a prescribed region on the surface of the p-type silicon substrate 20 by selective oxidation method. The first gate silicon oxide film 17 is formed on the surface of the p-type silicon substrate 20 by thermal oxidation. A polycrystal silicon layer 14a is then formed by CVD on the surface of the first gate silicon oxide film 17. The oxide film 25a and the silicon nitride ($Si_3N_4$) film 25b are sequentially formed on the surface of the polycrystal silicon layer 14a.

Figure 4B:
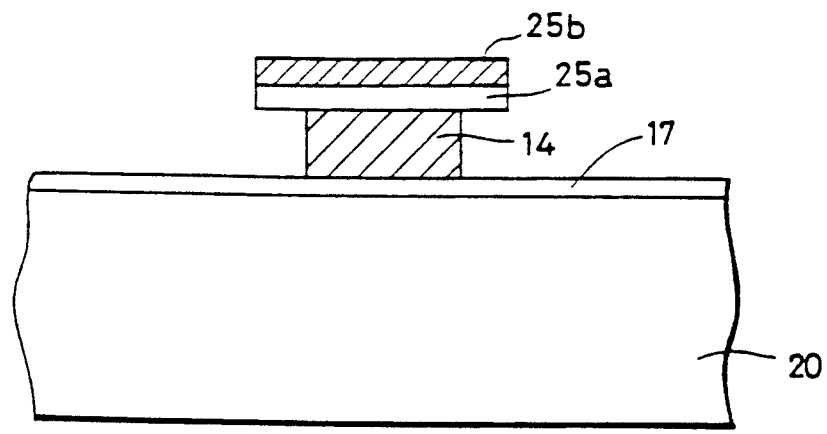

Referring to FIG. 4B, the nitride film 25b, the oxide film 25a and the polycrystal silicon layer 14a are patterned to a predetermined shape by photolithographic and etching methods. The etching step is divided into two etching substeps. In the first substep, the nitride film 25b and the oxide film 25a are etched to predetermined size in an atmosphere of ($CHF_3+O_2$) by plasma etching. In the second substep, the polycrystal silicon layer 14a is etched by plasma etching in an etching gas atmosphere consisting of a 1:2 mixture of Freon 114 ($C_2Cl_2F_4$) and $SF_6$. In this second substep, only the polycrystal silicon layer 14a is etched because of the different etching selectively between the nitride film 25b, the oxide film 25a and the polycrystal silicon layer 14a patterned during the first substep. By controlling the etching time duration, the floating gate 14 may be formed, in which the polycrystal silicon layer 14a is receded beyond the width of the patterned nitride film 25b. That is, the nitride film 25b and the oxide film 25a are formed which are provided with portions projecting in the form of a visor over the surface of the floating gate 14. The projecting portion of the nitride film 25b has a length of about 3000 Å.

Figure 4C:
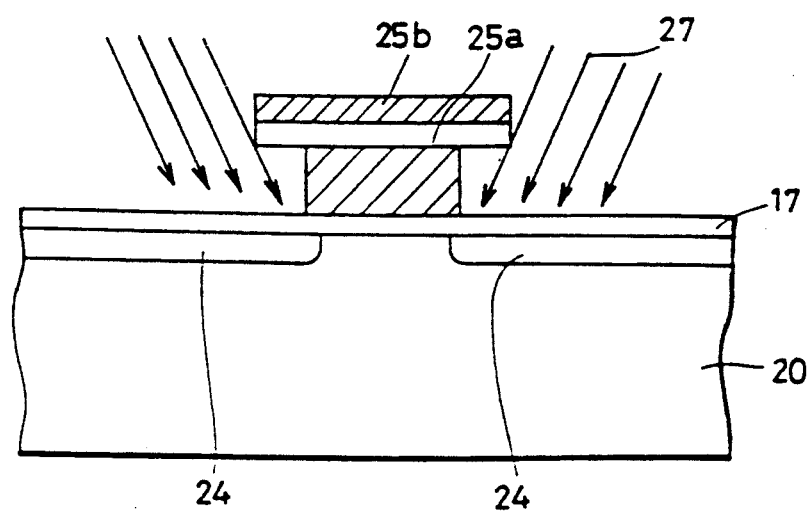

Then, as shown in FIG. 4C, n-type impurity ions 27 of a lower concentration are implanted into the surface of the p-type silicon substrate 20 by oblique rotational ion implantation method using the patterned silicon nitride film 25b as a mask. By this step, impurity regions 24, 24 of lower concentration are formed in the p-type silicon substrate 20. By the oblique rotational ion implantation method is meant a method consisting in placing the silicon substrate at a predetermined angle with respect to the outgoing direction of the impurity ions and rotating the silicon substrate about a vertical axis of the main surface of the substrate to effect ion implantation. For example, such conditions are employed as follows: a rotation speed of the substrate is 1.7 rps, the implantation angle is 45°, the implantation energy is 40 KeV and the implantation dose is $3\times10^{13}/cm^2$. As a result, the overlapped amount between the impurity region 24 and the floating gate 14 becomes about 0.15 μm.

Figure 4D:
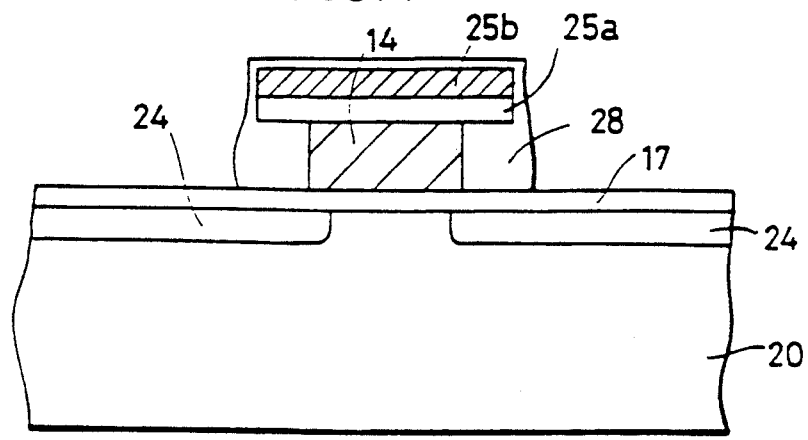

Then, referring to FIG. 4D, wet oxidation is performed at a lower temperature of 800° C. to form thin oxide films on the surfaces of the silicon nitride film 25b and the oxide film 25a. By this thermal oxidation, sidewall oxide films 28 are also formed on the sidewall of the floating gate 14.

Figure 4E:
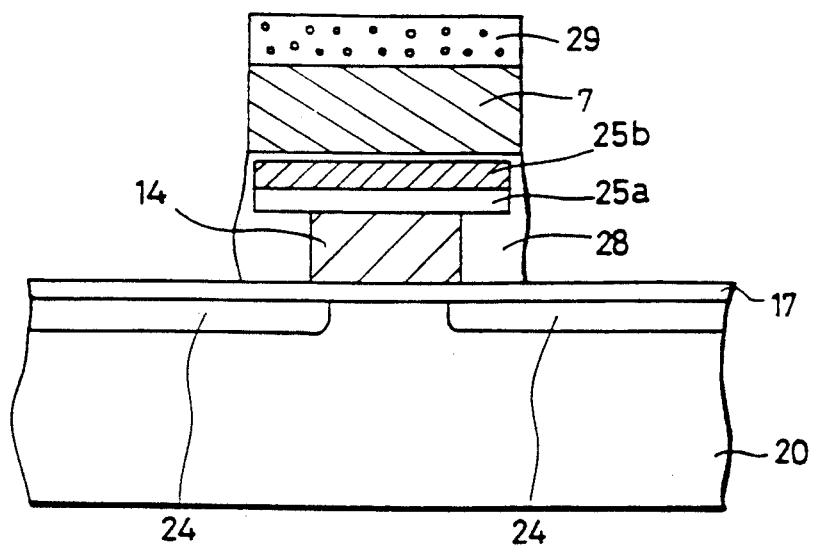

Then, as shown in FIG. 4E, a polycrystal silicon layer is formed by the CVD method and patterned to a predetermined shape by using the resist pattern 29. The control gate 7 has a film thickness of approximately 2000 Å to 3000 Å.

Figure 4F:
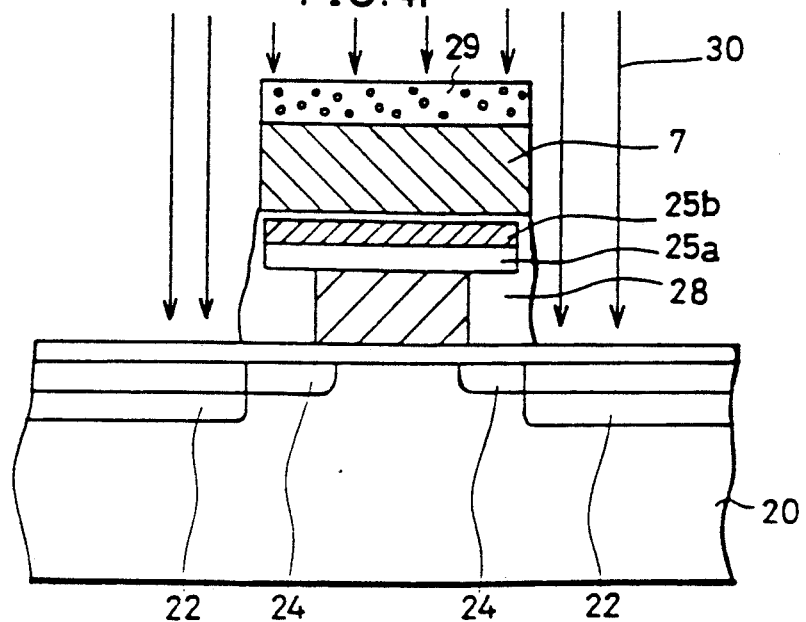

Then, as shown in FIG. 4F, n-type impurity ions 30 are implanted into the surface of the p-type silicon substrate 20 at a higher concentration in a direction substantially normal to the surface of the silicon substrate 20 using the resist pattern 29, control gate 7 and the sidewall oxide film 28 as the masks. In this manner, the impurity regions of a higher concentration 22, 22 are formed to complete the so-called LDD structure.

Thus, in the above described method, because of the LDD structure the oblique rotational ion implantation method for the impurity region of the lower concentration and the perpendicular ion implantation method for high concentration impurity region are used in combination, using the sidewall oxide film 28 as the mask. The film thickness of the film 28 on the sidewall of the floating gate 14 is controlled by the antioxidizing properties of the silicon nitride film 25b. Thus it becomes possible to control the width of diffusion of the impurity region 24 of the lower concentration by the film thickness of the sidewall oxide film 28, that is the length of the visor of the silicon nitride film 25b. On the other hand, this sidewall oxide film 28 may be formed by thermal oxidation at a relative low temperature. Thus it becomes possible to prevent the channel length from being decreased unnecessarily due to thermal diffusion of the impurity region 24 of the lower concentration formed in the p-type silicon substrate 20. The interlayer insulating film 25 is constituted by a laminated structure of the oxide film 25a and the nitride film 25b. Although the oxide film 25a is usually formed by the thermal oxidation method, the impurity region in the silicon substrate 20 becomes diffused, due to the high temperature treatment involved in thermal oxidation, as described hereinabove. For this reason, according to the present invention, the silicon oxide film 25a of the film thickness of about 200 Å to 300 Å is formed by shortening the time duration of thermal oxidation, and the nitride film 25b of about 200 Å in thickness is formed on the oxide film 25a to procure the insulating properties as the interlayer insulating layer. On the surface of the nitride film 25b, a thin oxide film in the order of several tens of Angstroms is formed simultaneously with formation of the sidewall film 28. In this manner, it becomes possible to compensate for defects, such as pin holes, that are liable to be formed in the thin nitride film 25b. An MOS transistor having a dual gate can be manufactured through the processes shown in FIGS. 4A to 4F.

Figure 5A:
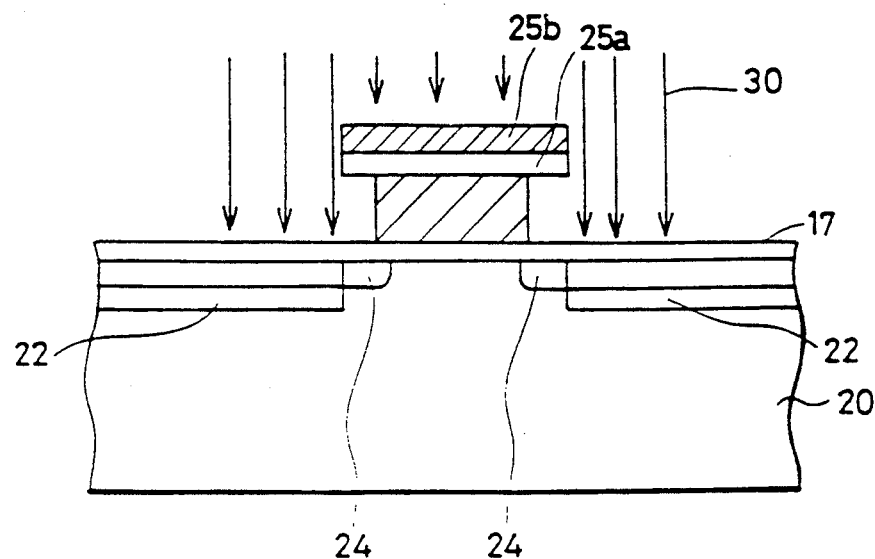
FIG. 5A is a cross-sectional view showing a production process which is a modification of the process shown in FIGS. 4A to 4F.

A modified production process for the reading transistor is hereinafter explained. FIG. 5A is a cross-sectional view showing the production process for the high concentration impurity region 22. This step is performed directly after the step of forming the impurity region of the lower concentration shown in FIG. 4C. That is, n-type impurity ions 30 are implanted at a higher concentration into the surface of the silicon substrate 20, using the nitride film 25b having a visor-like projection as the mask. In this manner, there are formed impurity regions 22, 22 of the higher concentration self-aligned with respect to the nitride film 25b.

Figure 5B:
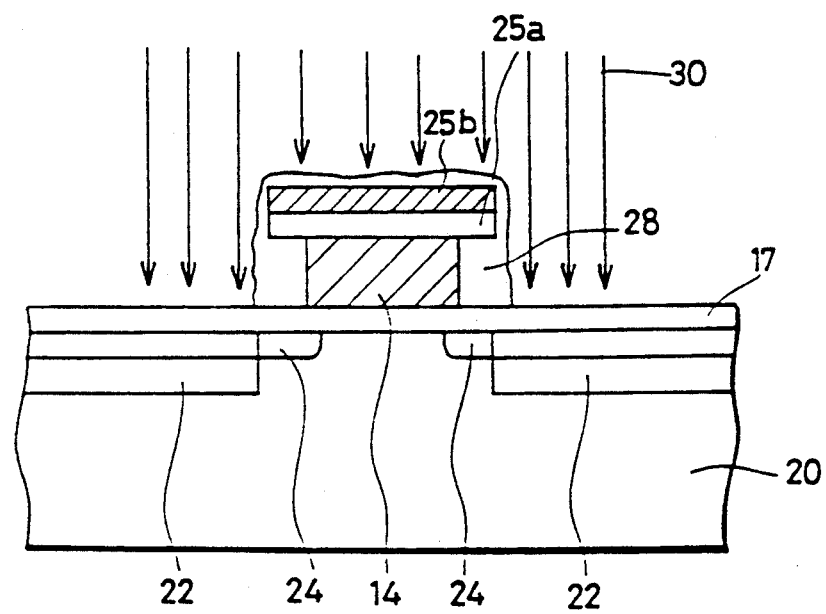
FIG. 5B is a cross-sectional view showing a production process which is another modification of the process shown in FIGS. 4A to 4F.

A further modification is explained by referring to FIG. 5B. The step shown therein is performed after the step of forming the sidewall oxide film 28 shown in FIG. 4D. That is, the impurity region of the higher concentration 22 is formed by perpendicular ion implantation method by using the sidewall oxide film 28 and the nitride film 25b as the masks. In this manner, the impurity region of the LDD structure is formed in the silicon substrate 20. The control gate 7 then is formed on the surface of the nitride film 25b.

Figure 6:
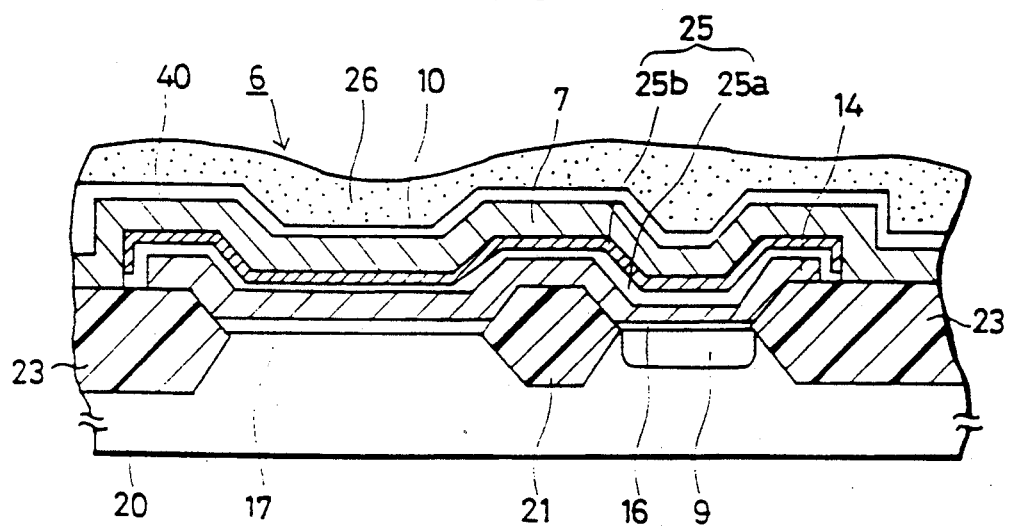
FIG. 6 shows a cross-sectional structure of an EEPROM memory cell according to a modification of the present invention and corresponding to the cross-sectional structure along section line II—II in FIG. 1.

A modification of the reading transistor 10 in the EEPROM memory cell according to the present invention is hereinafter explained. With the present reading transistor 10, shown in FIGS. 6 and 7, the interlayer insulating oxide film 25a, the interlayer insulating nitride film 25b and the control gate 7 are formed so as to overlie a portion of the sidewall of the floating gate 14. The impurity region of the reading transistor 10 has an LDD structure comprising n-type impurity regions of lower concentrations 24, 24 self-aligned with respect to the floating gate 4 and n-type impurity regions of higher concentrations 22, 24 self-aligned with respect to the control gate 7 or the interlayer insulating nitride film 25b. The interlayer insulating layer 25 has a laminated structure comprising of the silicon oxide film 25a and the silicon nitride film 25b. In general, when the silicon oxide film 25a is formed on the upper surface and the sidewall of the floating gate 14, the silicon oxide film 25a tends to have a reduced film thickness at the corners of the floating gate 14 of the rectangular cross-section. In such case, with a single-layer silicon oxide film 25a, the electrical field tends to be concentrated in the vicinity of the corners thereof to bring about insulation breakdown. However, with the present invention, the silicon oxide film 25a is formed on the surface of the silicon nitride film 25b to procure a predetermined thickness of the insulating layer to prevent deterioration of the resistance against insulation breakdown.

Figure 7:
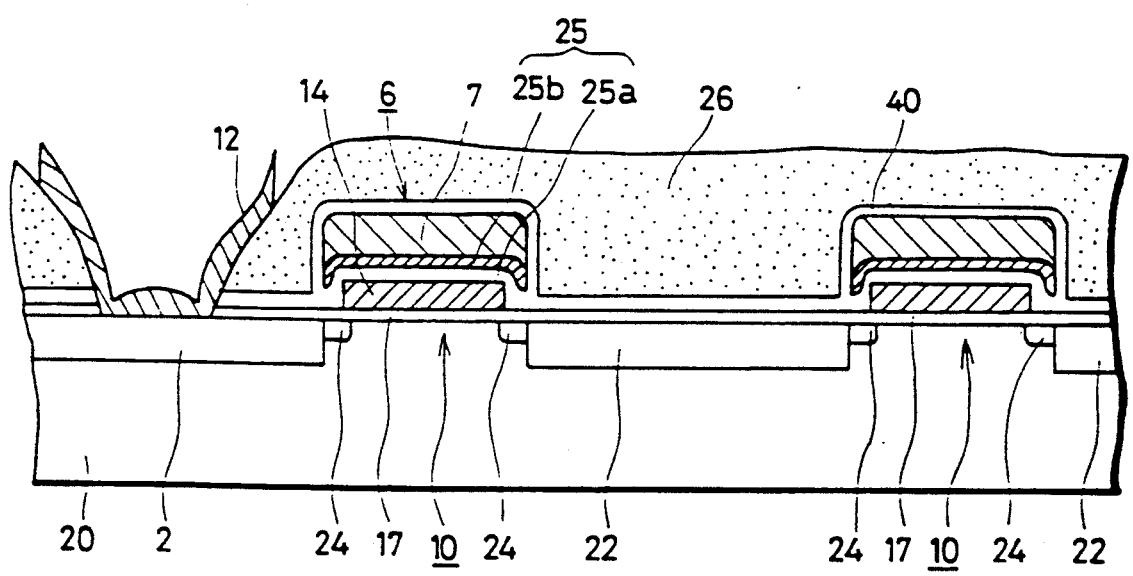
FIG. 7 shows a cross-sectional structure similar to FIG. 6, along section line III—III of FIG. 1.

The process for producing the reading transistor 10 shown in FIG. 7 is explained by referring to FIGS. 8A to 8E.

Figure 8A:
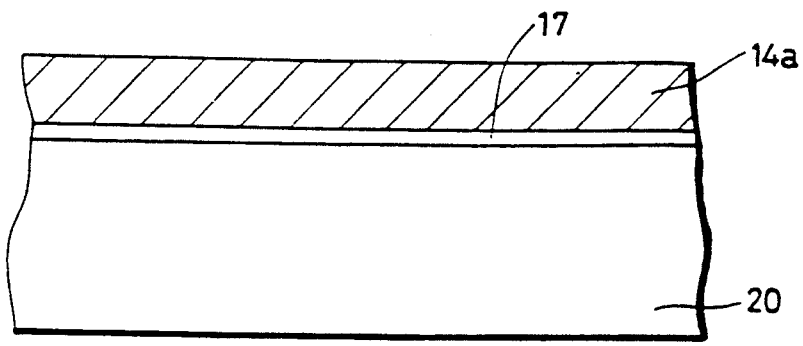
FIGS. 8A, 8B, 8C, 8D and 8E are cross-sectional views showing the production process of the reading transistor 10 shown in FIG. 7.

First, referring to FIG. 8A, a field isolation oxide film (not shown) is formed in a predetermined region on the surface of the p-type silicon substrate 20 by selective oxidation method. The first gate silicon oxide film 17 then is formed on the surface of the p-type silicon substrate 20 by thermal oxidation. The polycrystal silicon layer 14a then is formed on the surface of the silicon oxide film 17 by the CVD method.

Figure 8B:
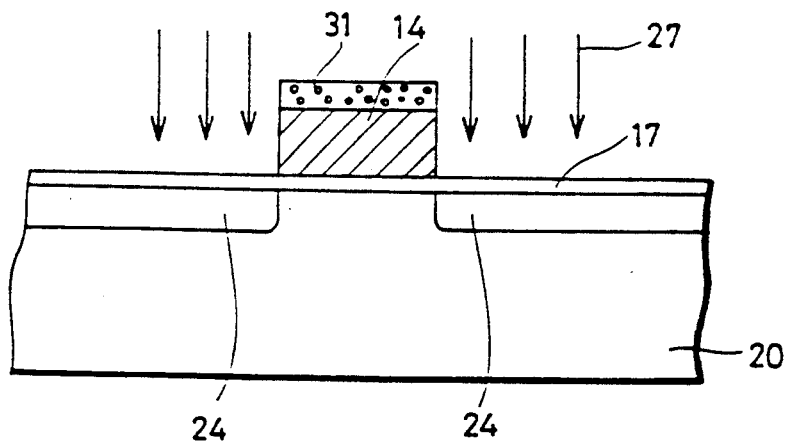

Then, as shown in FIG. 8B, the polycrystal silicon layer 14a is patterned to a predetermined shape using, as the mask, a resist 31 patterned by the photolithographic and etching methods. Thus the floating gate 14 is formed. Then, using the resist 31 and the floating gate 14 as masks, n-type impurity ions 27 are implanted at a lower concentration into the surface of the p-type silicon substrate 20. In this manner, the n-type impurity regions of the lower concentration 24, 24 are formed.

Figure 8C:
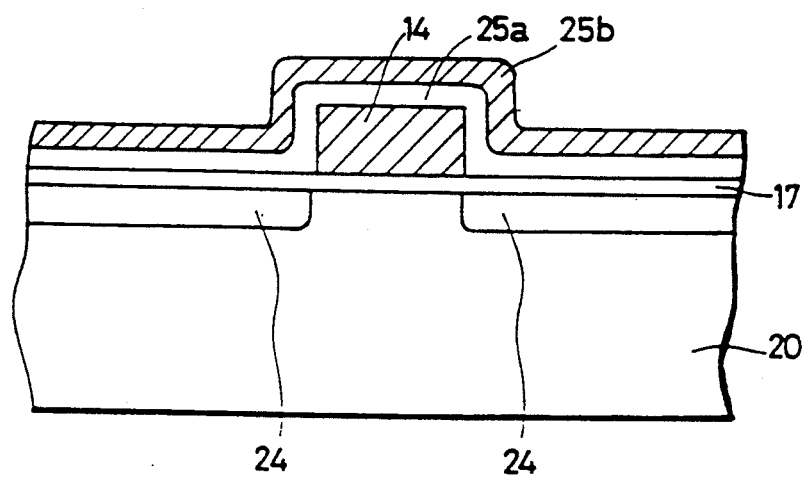

Then, as shown in FIG. 8C, the silicon oxide film 25a and the silicon nitride film 25b are formed in this order on the surface of the silicon substrate 20.

Figure 8D:
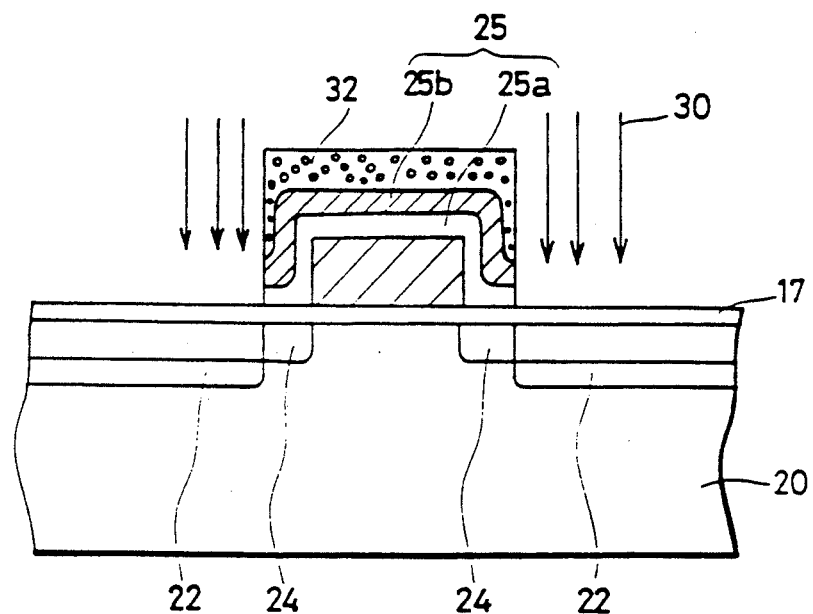

Then, as shown in FIG. 8D, the silicon nitride film 25b and the silicon oxide film 25a are patterned to a predetermined shape, using a resist pattern 32 as a mask. The patterned silicon nitride film 25b and silicon oxide film 25a overlie the surface and the sidewall of the floating gate 14. The n-type impurity ions of the higher concentration 30 are implanted by ion implantation into the surface of the p-type silicon substrate 20, using the resist pattern 32 or the patterned silicon nitride film 25b as the mask. In this manner, the n-type impurity regions of the higher concentrations 22, 22 are formed to complete the impurity region of the so-called LDD structure.

Figure 8E:
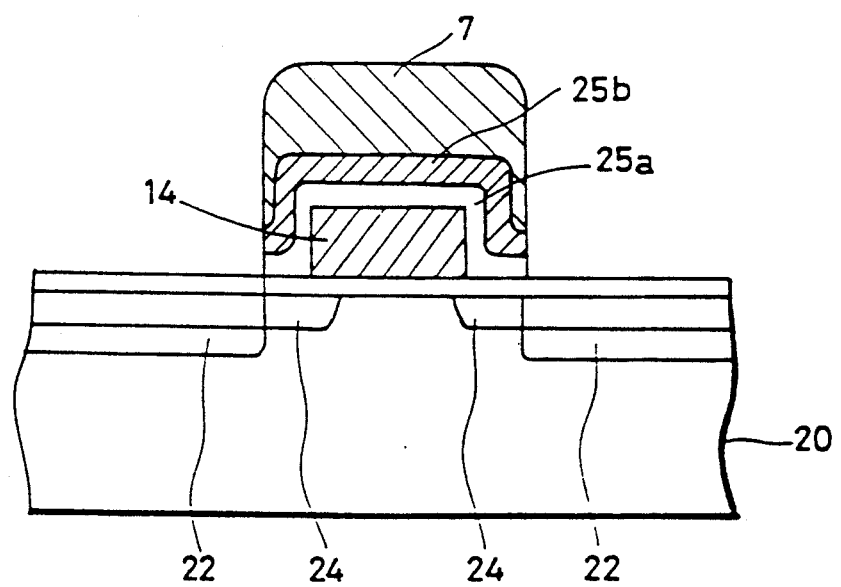
Figure 9:
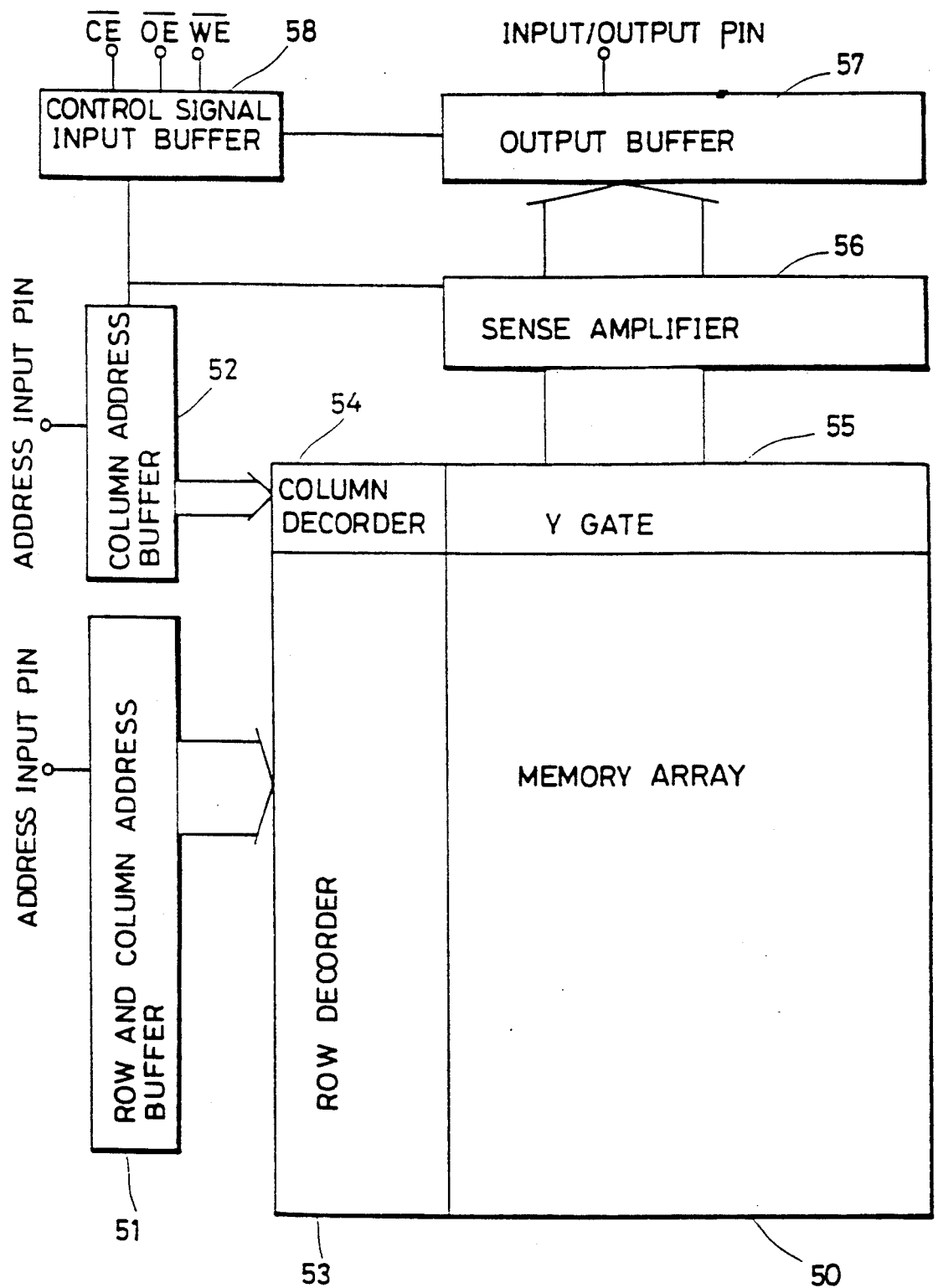
FIG. 9 is a block diagram showing the structure of a conventional EEPROM.
Figure 10:
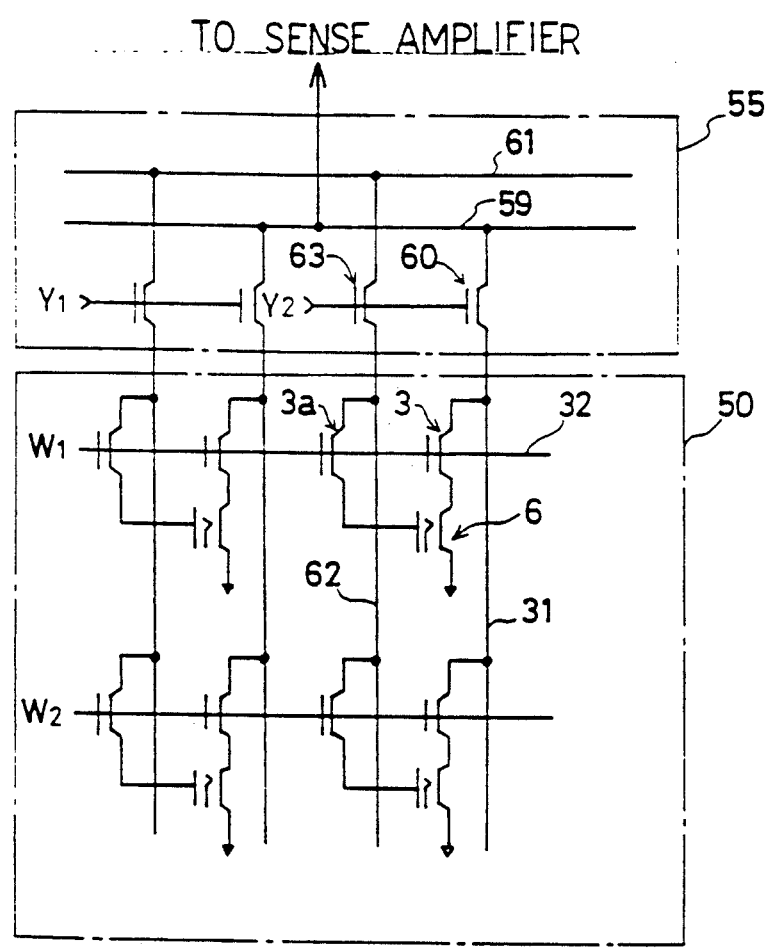
FIG. 10 is an equivalent circuit diagram of a memory cell array of the EEPROM shown in FIG. 9.
Figure 11:
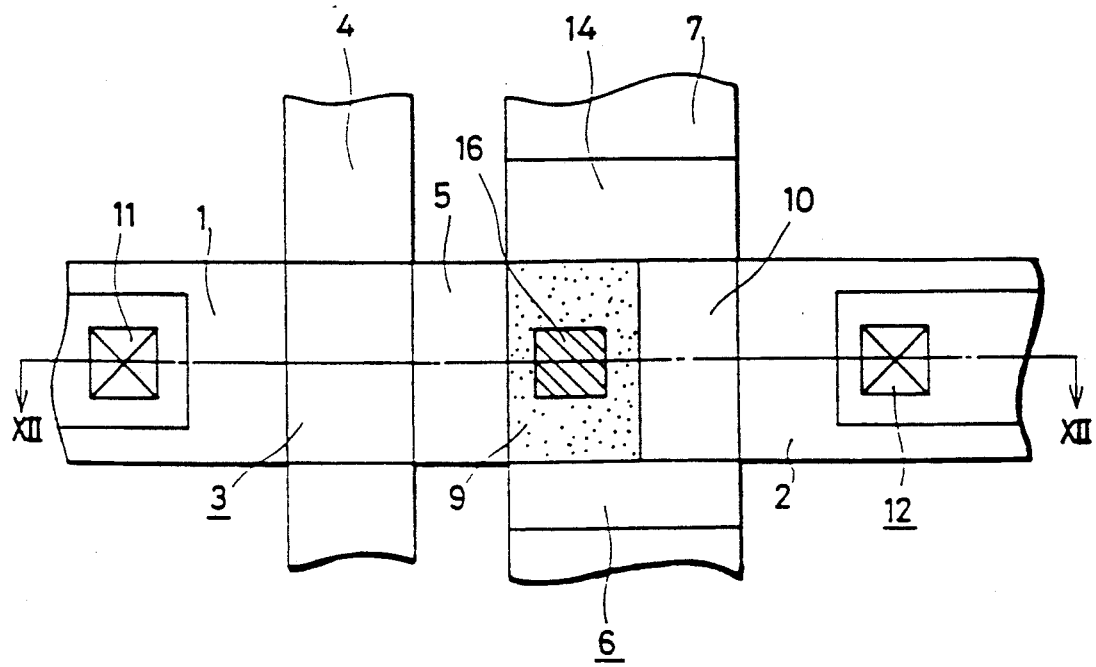
FIG. 11 shows a partial planar structure of the memory cell shown in FIG. 10.
Figure 12:
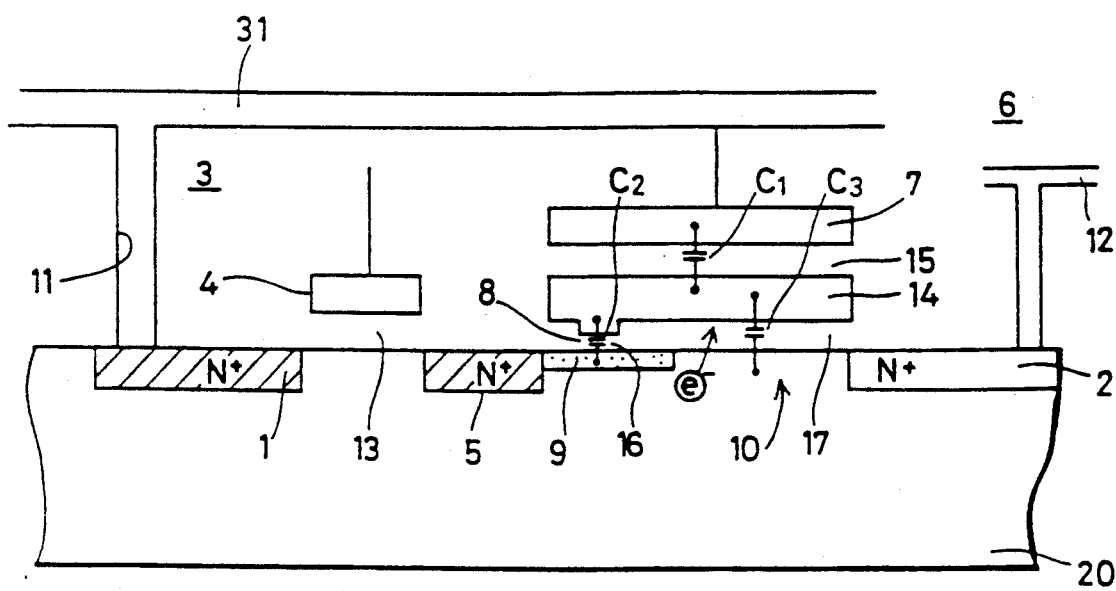
FIG. 12 is a schematic showing the cross-sectional structure along section line XII—XII in FIG. 1.

Then, after the resist 32 is removed, as shown in FIG. 8E, the polysilicon layer is deposited on the overall surface and patterned to a predetermined shape. In this manner, the control gate 7 of polysilicon is formed on the surface of the silicon nitride film 25b. By the above process, the reading transistor 10 provided with the impurity region having the LDD structure is completed.

Although the reading transistor 10 formed on the p-type silicon substrate 20 has been explained in the above described embodiment, the reading transistor may also be formed in the well region or on the silicon substrate having the reverse conductivity type.

With the non-volatile semiconductor memory device according to the present invention, the interlayer insulating layer between the first gate electrode and the second electrode having a dual gate structure is of a laminated structure, with the laminated insulating layer being larger in shape than the first gate electrode to form a so-called LDD structure within the interior of the semiconductor substrate. Thus the non-volatile semiconductor memory device having the LDD structure effective to suppress the hot electron effect may be realized without employing the step of forming the sidewalls.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A MOS transistor having a dual gate structure comprising:
    a semiconductor substrate of a first conductivity type having a major surface,
    a first gate insulating layer on the major surface of said semiconductor substrate,
    a first gate electrode formed on said first gate insulating layer and maintained in the electrically floating state,
    a second gate insulating layer formed on the surface of said first gate electrode and comprised of a laminated structure of first and second insulating layers,
    a second gate electrode formed on the surface of said second gate insulating layer, and
    a pair of impurity regions spaced apart from each other on opposite sides of said first gate electrode and defining a channel region in the semiconductor substrate,
    wherein said first insulating layer of said second gate insulating layer overlies the upper surface and the lateral surface of said first gate electrode,
    wherein said second insulating layer of said second gate insulating layer overlies the upper and lateral surfaces of said first insulating layer,
    wherein said pair of impurity regions each comprise a first impurity region of lower concentration and a second impurity region of higher concentration adjoining said first impurity region and spaced further from said channel region, and
    wherein said first impurity regions of lower concentration partially extend underneath said first gate electrode, and
    wherein said second impurity regions of higher concentration are self-aligned with said second gate insulating layer.

2. The MOS transistor according to claim 1, wherein said MOS transistor is a reading transistor of a non-volatile memory.

3. The MOS transistor according to claim 2, wherein said non-volatile memory is an EEPROM.

4. The MOS transistor according to claim 1, wherein said MOS transistor is a reading transistor for a multibit memory cell.

5. The transistor of claim 1, wherein the length of the second gate in a channel direction between the pair of impurity regions is greater than that of said first gate in said channel direction.

6. The transistor of claim 1, wherein said first insulating layer of said second gate insulating layer is of silicon oxide and said second insulating layer of said second gate insulating layer is of silicon nitride.

7. The MOS transistor according to claim 19, wherein
another oxide film is formed on a lateral surface of said nitride film of said second gate insulating layer.

8. A MOS transistor having a dual gate structure comprising:
a semiconductor substrate of a first conductivity type having a major surface,
a first gate insulating layer on the major surface of said semiconductor substrate,
a first gate electrode formed on said first gate insulating layer and maintained in the electrically floating state,
a second gate insulating layer formed on the surface of said first gate electrode and comprised of a laminated structure of first and second insulating layers.
a second gate electrode formed on the surface of said second gate insulating layer, and
a pair of impurity regions spaced apart from each other on opposite sides of said first gate electrode and defining a channel region in the semiconductor substrate,
wherein said first insulating layer of said second gate insulating layer overlies the upper surface and the lateral surface of said first gate electrode,
wherein said second insulating layer of said second gate insulating layer overlies the upper and lateral surfaces of said first insulating layer,
wherein said pair of impurity regions each comprise a first impurity region of lower concentration and a second impurity region of higher concentration adjoining said first impurity region and spaced further from said channel region, and
wherein said first impurity regions of lower concentration partially extend underneath said first gate electrode, and
wherein said second impurity regions of higher concentration are self-aligned with said second gate electrode.

9. The MOS transistor according to claim 8, wherein said MOS transistor is a reading transistor of a non-volatile memory.

10. The MOS transistor according to claim 9, wherein said non-volatile memory is an EEPROM.

11. The MOS transistor according to claim 8, wherein said MOS transistor is a reading transistor for a multibit memory cell.

12. The MOS transistor of claim 8, wherein the length of the second gate in a channel direction between the pair of impurity regions is greater than that of said first gate in said channel direction.

13. The MOS transistor of claim 8, wherein said first insulating layer of said second gate insulating layer is of silicon oxide and said second insulating layer of said second gate insulating layer is of silicon nitride.

14. The MOS transistor according to claim 13, wherein another oxide film is formed on a lateral surface of said nitride film of said second gate insulating layer.

* * * * *